United States Patent
Nguyen et al.

(10) Patent No.: US 11,531,073 B2
(45) Date of Patent: Dec. 20, 2022

(54) FIBER-COUPLED SPIN DEFECT MAGNETOMETRY

(71) Applicant: X Development LLC, Mountain View, CA (US)

(72) Inventors: Christian Thieu Nguyen, San Diego, CA (US); Stefan Bogdanovic, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 17/139,807

(22) Filed: Dec. 31, 2020

(65) Prior Publication Data
US 2022/0206086 A1    Jun. 30, 2022

(51) Int. Cl.
*G01R 33/028* (2006.01)
*G01N 24/10* (2006.01)
*G01R 33/032* (2006.01)

(52) U.S. Cl.
CPC ............ *G01R 33/028* (2013.01); *G01N 24/10* (2013.01); *G01R 33/032* (2013.01)

(58) Field of Classification Search
CPC ..... G01R 33/028; G01R 33/032; G01N 24/10
See application file for complete search history.

(56) References Cited

U.S. PATENT DOCUMENTS

| | | | |
|---|---|---|---|
| 8,547,090 B2 | 10/2013 | Lukin et al. | |
| 8,693,813 B1 * | 4/2014 | Carralero | G01L 1/24 359/290 |
| 8,947,080 B2 | 2/2015 | Lukin et al. | |
| 9,245,551 B2 | 1/2016 | Hallak et al. | |
| 9,541,610 B2 | 1/2017 | Kaup et al. | |
| 9,557,391 B2 | 1/2017 | Egan et al. | |
| 9,823,313 B2 | 11/2017 | Hahn et al. | |

(Continued)

FOREIGN PATENT DOCUMENTS

| | | | |
|---|---|---|---|
| CN | 102193074 | 9/2011 | |
| CN | 108254708 A * | 7/2018 | ............ G01R 33/032 |

(Continued)

OTHER PUBLICATIONS

Patel et al., "Subnanotesla magnetometry with a fiber-coupled diamond sensor," Physical Review Applied, Oct. 2020, 14(4):044058.

(Continued)

*Primary Examiner* — Jay Patidar
(74) *Attorney, Agent, or Firm* — Fish & Richardson P.C.

(57) ABSTRACT

A magnetometer includes an electron spin defect body including a plurality of lattice point defects. A microwave field transmitter is operable to apply a microwave field to the electron spin defect body. An optical source is configured to emit input light of a first wavelength that excites the plurality of lattice point defects of the electron spin defect body from a ground state to an excited state. A first optical fiber has an input end optically coupled to the optical source and an output end. The output end is attached to a first face of the electron spin defect body and is arranged to direct the input light into the first face of the electron spin defect body. A second optical fiber has an output end and an input end. A photodetector is optically coupled to the output end of the second optical fiber.

14 Claims, 8 Drawing Sheets

(56) References Cited

U.S. PATENT DOCUMENTS

| | | | |
|---|---|---|---|
| 9,823,314 | B2 | 11/2017 | Hahn et al. |
| 9,851,418 | B2 | 12/2017 | Wolf et al. |
| 9,910,105 | B2 | 3/2018 | Boesch et al. |
| 10,006,973 | B2 | 6/2018 | Hahn et al. |
| 10,012,704 | B2 | 7/2018 | Coar |
| 10,082,545 | B2 | 9/2018 | Jeske et al. |
| 10,123,714 | B2 | 11/2018 | Hatano et al. |
| 10,126,377 | B2 | 11/2018 | Hahn et al. |
| 10,145,910 | B2 * | 12/2018 | Jackson .............. G01R 33/26 |
| 10,168,393 | B2 | 1/2019 | Stetson et al. |
| 10,274,551 | B2 | 4/2019 | Hruby et al. |
| 10,330,744 | B2 | 6/2019 | Luzod |
| 10,338,164 | B2 | 7/2019 | Hahn et al. |
| 10,345,396 | B2 | 7/2019 | Manickam et al. |
| 10,359,479 | B2 | 7/2019 | Manickam et al. |
| 10,379,069 | B2 | 8/2019 | Hatano et al. |
| 10,408,890 | B2 | 9/2019 | Bruce et al. |
| 10,459,041 | B2 | 10/2019 | Hahn et al. |
| 10,495,698 | B2 | 12/2019 | Jeske et al. |
| 10,502,796 | B2 | 12/2019 | Hatano et al. |
| 10,564,231 | B1 | 2/2020 | Mandeville et al. |
| 10,677,953 | B2 | 6/2020 | Stetson et al. |
| 10,712,408 | B2 | 7/2020 | Pham et al. |
| 10,753,990 | B2 | 8/2020 | Niu et al. |
| 10,816,616 | B2 | 10/2020 | Manickam et al. |
| 2010/0271016 | A1 * | 10/2010 | Barclay .............. G01R 33/032 264/1.25 |
| 2019/0018076 | A1 | 1/2019 | Hahn et al. |
| 2019/0018088 | A1 | 1/2019 | Hu et al. |
| 2019/0219645 | A1 | 7/2019 | Hahn et al. |
| 2019/0235031 | A1 | 8/2019 | Ibrahim et al. |
| 2020/0049776 | A1 | 2/2020 | Wood et al. |
| 2020/0158798 | A1 | 5/2020 | Huck et al. |
| 2020/0281499 | A1 | 9/2020 | Maeda et al. |
| 2020/0305747 | A1 | 10/2020 | Kudo et al. |
| 2020/0347515 | A1 | 11/2020 | Markham et al. |
| 2020/0348378 | A1 | 11/2020 | Alford et al. |
| 2021/0378569 | A1 | 12/2021 | Zongin et al. |

FOREIGN PATENT DOCUMENTS

| | | |
|---|---|---|
| CN | 208125759 | 11/2018 |
| CN | 208255383 | 12/2018 |
| CN | 106414818 | 4/2019 |
| CN | 110133545 | 8/2019 |
| CN | 110325869 | 10/2019 |
| CN | 105223521 | 2/2020 |
| CN | 210347904 | 4/2020 |
| CN | 111175678 | 5/2020 |
| CN | 111198344 | 5/2020 |
| CN | 108983121 | 7/2020 |
| CN | 111426992 | 7/2020 |
| CN | 111568418 | 8/2020 |
| CN | 110554332 | 1/2021 |
| DE | 102018202588 | 8/2019 |
| DE | 102018208055 | 11/2019 |
| DE | 102018214617 | 3/2020 |
| DE | 102018216033 | 3/2020 |
| DE | 102018220234 | 5/2020 |
| DE | 102019203929 | 9/2020 |
| DE | 102019203930 | 9/2020 |
| EP | 3242139 | 11/2017 |
| EP | 3373023 | 9/2018 |
| GB | 2574643 | 12/2019 |
| JP | 2017067650 | 4/2017 |
| WO | WO2019168097 | 9/2019 |
| WO | WO2020157497 | 8/2020 |

OTHER PUBLICATIONS

Dimitriev et al., "Concept of a microscale vector magnetic field sensor based on nitrogen-vacancy centers in diamond," Journal of the Optical Society of America B, Mar. 2016, 33(3):B1-B4.
International Search Report and Written Opinion in International Appln. No. PCT/US2021/065511, dated Apr. 4, 2022, 72 pages.
Masis et al., "Multiphoton resonances in nitrogen-vacancy defects in diamond," CoRR, Apr. 2019, arxiv.org/abs/1904.04783, 9 pages.
Zhang et al., "Diamond Nitrogen-Vacancy Center Magnetometry: Advances and Challenges," CoRR, Oct. 2020, arxiv.org/abs.2010.10231, 17 pages.

* cited by examiner

FIBER-COUPLED SPIN DEFECT MAGNETOMETRY

BACKGROUND

Various sensors are available that rely on classical physical phenomena for detecting properties such as electric or magnetic fields. In certain cases, magnetic field detectors are limited by one or more of their sensitivity, dynamic range and/or form factor.

SUMMARY

The present disclosure relates to fiber-coupled electron spin defect based magnetometry. In some examples, the disclosure describes a magnetometer including an electron spin defect body including a plurality of lattice point defects. A microwave field transmitter is operable to apply a microwave field to the electron spin defect body. An optical source is configured to emit input light of a first wavelength that excites the plurality of lattice point defects of the electron spin defect body from a ground state to an excited state. A first optical fiber has an input end optically coupled to the optical source and an output end. The output end is attached to a first face of the electron spin defect body and is arranged to direct the input light into the first face of the electron spin defect body. A second optical fiber has an output end and an input end. The input end of the second optical fiber is attached to a second face of the electron spin defect body and is arranged to receive photoluminescence of a second wavelength emitted from the electron spin defect body through the second face of the electron spin defect body. The second wavelength is different from the first wavelength and wherein the second face is different from the first face. A photodetector is optically coupled to the output end of the second optical fiber.

Examples of magnetometers may include any one or more of the following features.

In some implementations, a magnetometer includes a third optical fiber. The third optical fiber has an output end optically coupled to the photodetector and an input end. The input end of the third optical fiber is attached to a third face of the electron spin defect and is arranged to receive the photoluminescence through the third face. The third face is different from the first face and the second face.

In some implementations, a magnetometer includes a third optical fiber. The third optical fiber has an input end optically coupled to the optical source and an output end, wherein the output end of the third optical fiber is attached to the first face of the electron spin defect body and arranged to direct the input light into the first face of the electron spin defect body.

In some implementations, the first optical fiber and the second optical fiber are attached to the electron spin defect body by an adhesive that is substantially transparent to light of the first wavelength and light of the second wavelength.

In some implementations, the second optical fiber includes a Bragg filter configured to pass light of the second wavelength and block light of the first wavelength.

In some implementations, the second face includes a thin-film optical filter configured to pass light of the second wavelength and block light of the first wavelength.

In some implementations, a magnetometer includes an optical filter coupled to the output end of the second optical fiber. The optical filter is configured to pass light of the second wavelength and block light of the first wavelength.

In some implementations, the magnetometer includes a magnet arranged adjacent to the electron spin defect body.

This disclosure also describes methods. In some examples, the disclosure describes a method of measuring a time-varying magnetic field. Input light of a first wavelength is provided into an input end of a first optical fiber. An output end of the first optical fiber is attached to a first face of an electron spin defect body and is arranged to direct the input light into the first face of the electron spin defect body. The electron spin defect body is exposed to the time-varying magnetic field. At a photodetector, photoluminescence of a second wavelength is received emitted from the electron spin defect body. The photoluminescence is carried from a second face of the electron spin defect body to the photodetector by a second optical fiber. An input end of the second optical fiber is attached to the second face of the electron spin defect body. The second wavelength is different from the first wavelength, and the second face is different from the first face. Information about the time-varying magnetic field is determined based on the received photoluminescence.

Examples of methods of measuring a time-varying magnetic field may include any one or more of the following features.

In some implementations, the photoluminescence is filtered to block light of the first wavelength and pass light of the second wavelength.

In some implementations, the photoluminescence is filtered using a Bragg filter embedded in the second optical fiber.

In some implementations, the photoluminescence is filtered using a thin-film optical filter disposed on the second face of the electron spin defect body.

In some implementations, the photoluminescence is filtered using a fiber-coupled filter coupled to the second optical fiber.

In some implementations, a microwave signal is applied to the electron spin defect body.

In some implementations, a second magnetic field is applied to the electron spin defect body.

This disclosure also describes methods of manufacturing a magnetometer. In some implementations, a method of manufacturing a magnetometer includes attaching an input end of a second optical fiber to a second face of an electron spin defect body, and attaching an output end of a first optical fiber to a first face of the electron spin defect body, the first face is different from the second face.

Examples of methods of manufacturing a magnetometer may include any one or more of the following features.

In some implementations, prior to attaching the input end of the second optical fiber, a thin-film optical filter is deposited onto the second face of the electron spin defect body. The electron spin defect body includes a plurality of lattice point defects, and the thin-film optical filter is configured to pass photoluminescence of a second wavelength emitted by the plurality of lattice point defects and to block light of a first wavelength different from the second wavelength.

In some implementations, the first wavelength is a wavelength that excites the plurality of lattice point defects from a ground state to an excited state.

In some implementations, a plurality of dielectric films are deposited onto the second face.

In some implementations, a photodetector is coupled to an output end of the second optical fiber, and a light source is coupled to an input end of the first optical fiber. The light source is configured to emit light of the first wavelength.

Implementations according to the present disclosure may provide one or more of the following advantages. Efficiency of light coupling into an electron spin defect body may be increased. Efficiency of light coupling out of an electron spin defect body may be increased. A greater proportion of emitted photoluminescence may be collected. Magnetometer size may be reduced. Magnetometer reliability and robustness may be improved.

The details of one or more embodiments are set forth in the accompanying drawings and the description below. Other features, objects, and advantages of the invention will be apparent from the description and drawings, and from the claims.

DETAILED DESCRIPTION

The present disclosure relates to electron spin defect based magnetometry. In particular, the present disclosure relates to the use of optical fibers for carrying light in and out of electron spin defect bodies. Zeeman shifts of electron spin sublevels established by the presence of electron spin defects in the electron spin defect bodies are monitored in order to sense magnetic fields.

More specifically, electron spin defect based magnetometers include quantum sensors that leverage the occurrence of an electronic spin defect in a solid state lattice, where the spin can be both initialized and read out optically. In certain implementations, the defect may arise as an atomic-level vacancy in a lattice structure (sometimes called a "defect body"), such as a vacancy occurring near a nitrogen atom substituted in place of a carbon atom within diamond. Accordingly, a single spin defect center, as an atom-scale defect, may be used to detect magnetic fields with nanometer spatial resolution, while an ensemble of uncorrelated spin defects may be used with spatial resolution given by the ensemble size (e.g., on the order of microns) typically with an improvement in sensitivity given by $\sqrt{N}$, where N is the number of spin defects. Moreover, in some implementations, electron spin defect based magnetometers may exhibit relatively long coherence times, such as times approaching 1 second or more. Additionally, electron spin defect based magnetometers may be operated at room temperature and, in certain cases, within relatively compact structures, allow for portability and reduction in magnetometer costs, which may be advantageous in health related applications such as measuring magnetic fields emanating from the heart.

Figure 1:
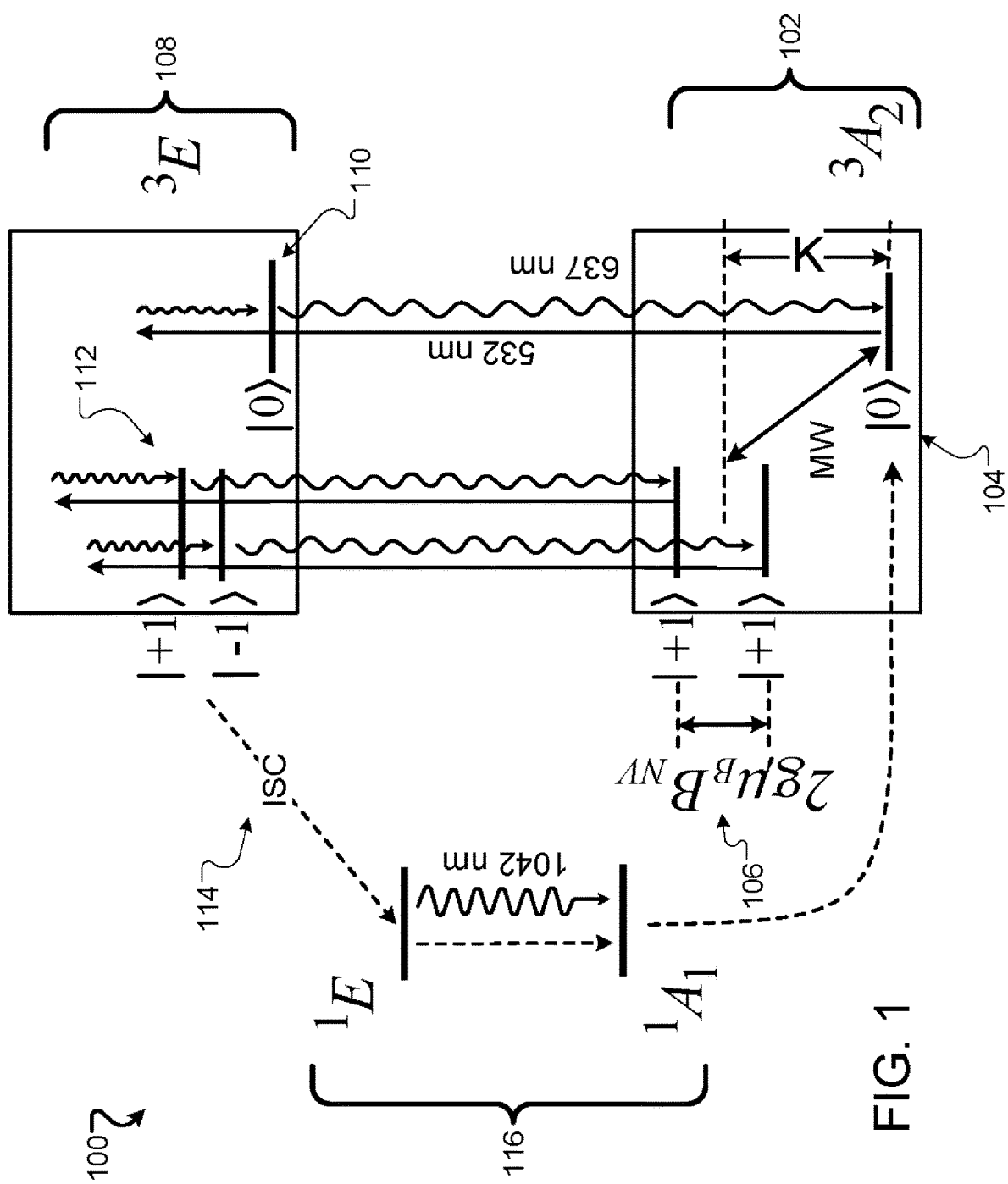
FIG. 1 is a schematic that illustrates an exemplary energy level scheme for a nitrogen-vacancy defect.

A brief description of electron spin defect based magnetometry will be described with reference to FIGS. 1-2 and in particular with respect to nitrogen vacancy (NV) magnetometry, though the techniques and devices disclosed herein may be applicable to other materials, including other types of electron spin defects, as well. An NV center is a defect in a diamond lattice (defect body) that contains a substitutional nitrogen atom in place of carbon, adjacent to a vacancy in the diamond lattice. The negatively-charged state of the defect provides a spin triplet ground level which can be initialized, coherently manipulated with long coherence time and readout, using optical means. FIG. 1 is a schematic that illustrates an energy level scheme 100 for an NV defect. The NV defect behaves as an artificial atom within the diamond lattice that exhibits a broadband photoluminescence emission with a zero phonon line at 1.945 eV or $\lambda_{PL}$=637 nm. Moreover, the ground levels or ground states 102 of the NV defect are spin triplet states, having spin sub-levels of the $m_s$=0 state 104 and the $m_s$=+/−1 states 106, separated by K=2.87 GHz in the absence of a magnetic field. The defect can be optically excited to an excited level 108, which also is a spin triplet having an $m_s$=0 state 110 and $m_s$=+/−1 states 112. Once optically excited into the excited level 108, the NV defect can relax primarily through one of two mechanisms: a) through a radiative transition and phonon relaxation, thus producing a broadband red photoluminescence; or b) through a secondary path 114 that involves non-radiative intersystem crossing to singlet states 116.

The decay path branching ratios from the excited state manifold back to the ground state manifold depends on its initial spin sublevel projection. Specifically, if the electron spin began in the $m_s$=+/−1 states, there is approximately a 30% chance for the spin to decay non-radiatively through the secondary path 114, down to the $m_s$=0 state. The population of the spin sublevels can be manipulated by the application of a resonant microwave field to the diamond. Specifically, at a particular microwave frequency (e.g., a resonance frequency) corresponding to the transition energy between the 0 and +/−1 states, transitions occur between those sublevels, resulting in a change in the level of photoluminescence of the system. In particular, if the spin is initialized into the $m_s$=0 state, and the population is transferred to one of the +/−1 states by the resonant microwave drive, the photoluminescence rate upon subsequent optical illumination will decrease.

Figure 2:
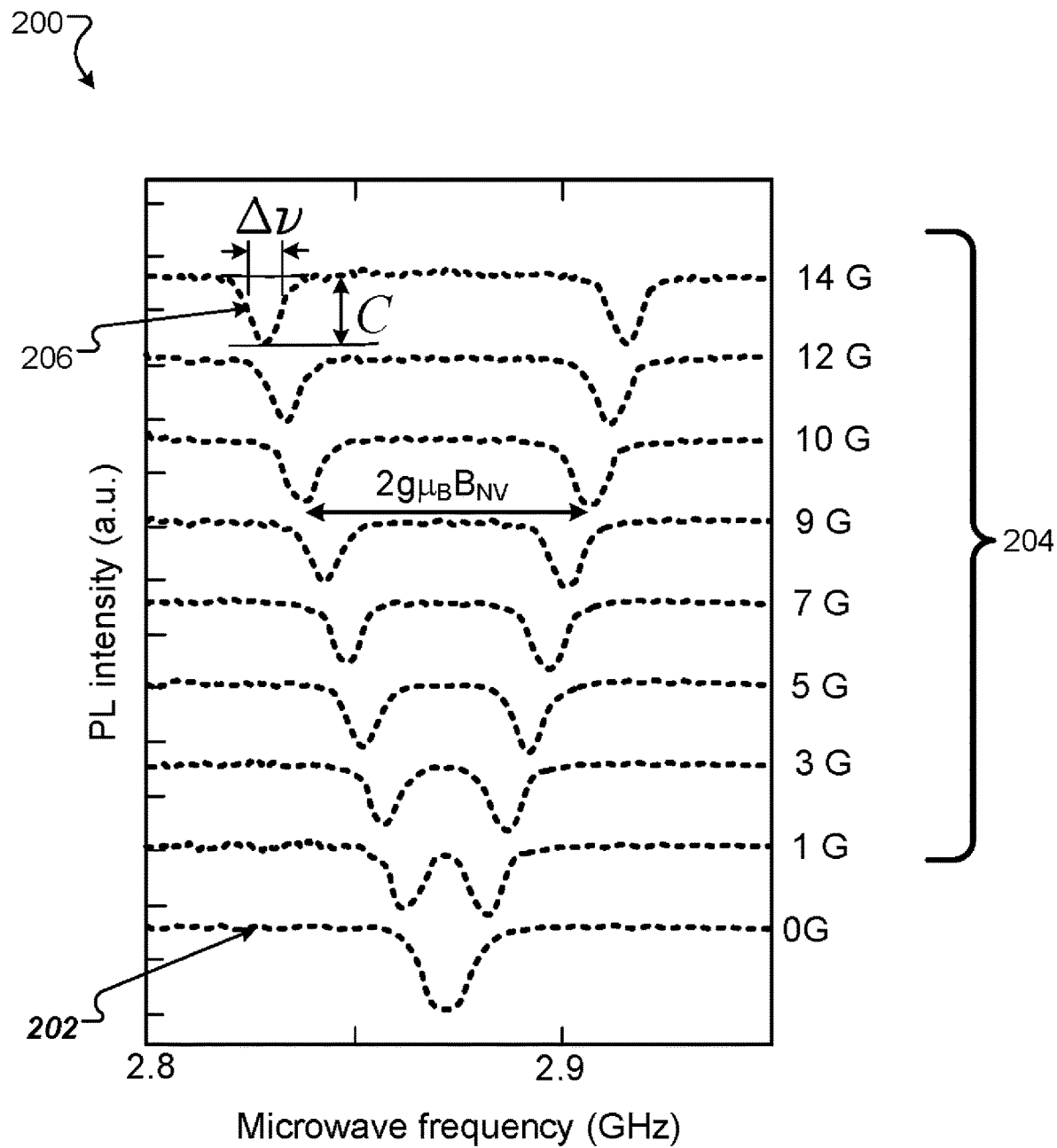
FIG. 2 is a plot of exemplary photoluminescence intensity versus applied microwave frequency.

This drop in photoluminescence may be observed by sweeping the microwave frequency, as depicted in the bottom-most photoluminescence (PL) intensity line 202 shown in FIG. 2, which is a plot of PL intensity versus applied microwave frequency. Upon applying a magnetic field in the vicinity of the NV defect, however, the degeneracy of the $m_s$=+/−1 spin sublevels is lifted by the Zeeman effect, leading to the appearance of two electron spin resonance (ESR) transitions, corresponding to dips in the PL spectrum (see upper PL lines 204 in FIG. 2). The value Av corresponds to the ESR linewidth, typically on the order of 1 MHz, and the value C is the ESR contrast, typically on the order of a few percent. To detect small magnetic fields, the NV transitions may be driven at the point of maximum slope (see, e.g., 206 in FIG. 2). At this point of maximum slope, a time-domain change in the photoluminescence may be detected, from which a time-domain change in magnetic field can be derived. The signal may be expressed as $(\partial I_0/\partial B) \times \delta B \times \Delta t$, where $I_0$ is the NV defect PL rate, $\delta B$ is the infinitesimal magnetic field variation, and $\Delta t$ is the measurement duration, much smaller than the timescale on which the magnetic field changes A single NV defect therefore can serve as a magnetic field sensor with an atomic-sized detection volume. To improve sensitivity, a collective response of an ensemble of NV defects may be detected, such that the collected PL signal is magnified by the number N of the sensing spins and therefore improves the shot-noise limited magnetic field sensitivity by a factor of $1/\sqrt{N}$.

Figure 3:
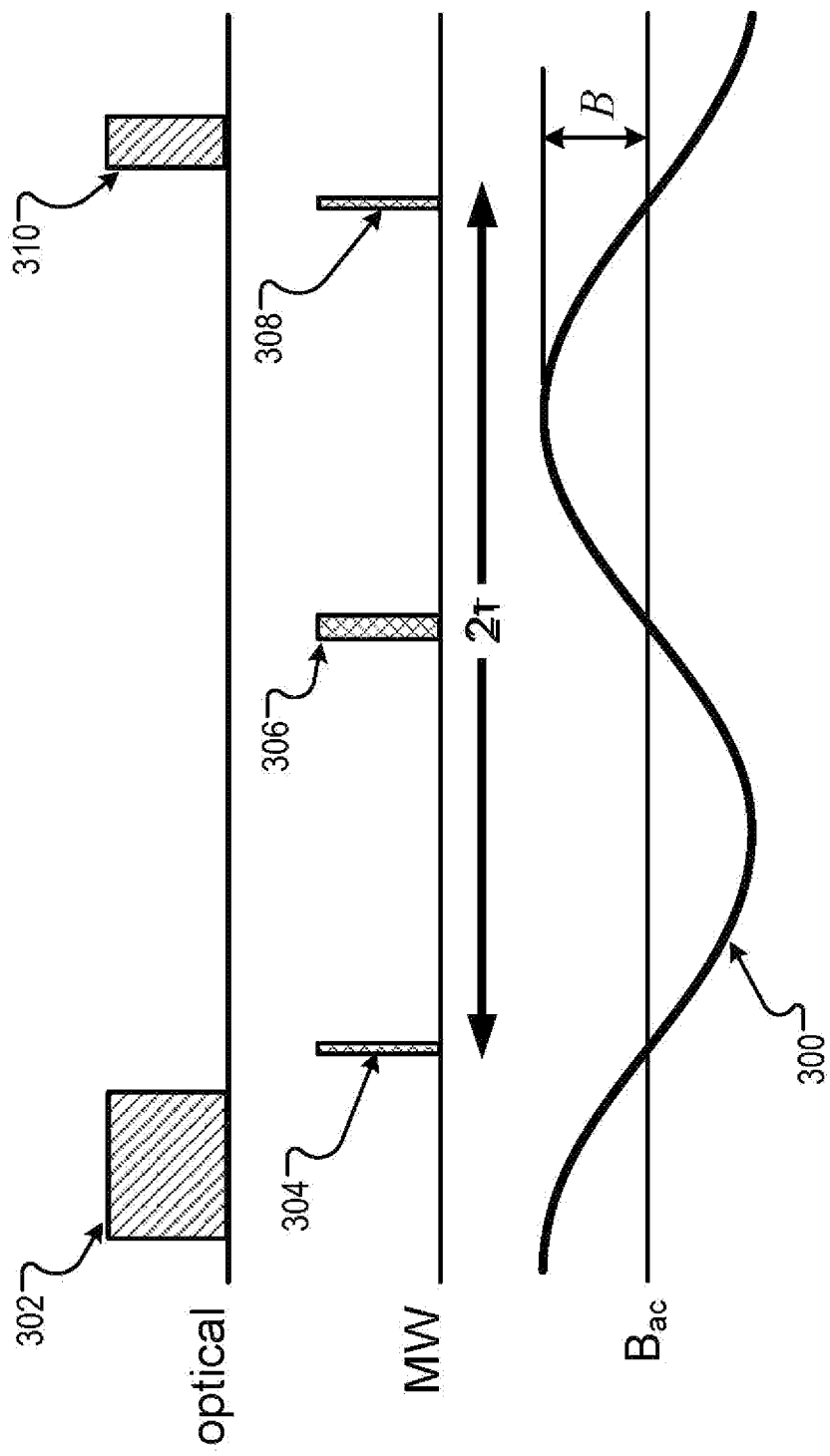
FIG. 3 is a schematic that illustrates an exemplary process for performing electron spin defect based magnetometry to detect an AC magnetic field.

Magnetic field sensitivity can further be improved if the magnetic field to be measured is periodic in time (e.g., an AC field). The improvement in sensitivity with a classical AC field is a result of a prolongation of the NV spin coherence that can be achieved through dynamical decoupling of the central spin from its environment. To avoid broadening of the ESR linewidth caused by the laser readout process and the driving microwave field, the spin manipulation, spin readout and phase accumulation (magnetic field measurement) may be separated in time. To do so, a series of microwave pulses are applied in sequence to the NV defect (or defects) that is in a prepared state |0>. Here |0> and |1> denote the electron spin states $m_s=0$ and $\underline{m}_s=1$. FIG. 3 is a schematic that illustrates an example of electron spin defect based magnetometry for an AC magnetic field, in which a microwave pulse sequence is applied to an NV defect or ensemble of NV defects. The pulse sequence may also be referred to as the "Hahn echo," though other dynamical decoupling pulse sequences may be used instead. In particular, a first light pulse 302 is applied to the NV defect, or ensemble of NV defects, to place them in a prepared state |0>. While the NV defect(s) are exposed to an alternating magnetic field 300, a first π/2 microwave pulse 304, is applied to the NV defect(s) to rotate the electron spin of the NV defect(s) from the prepared state |0> to a coherent superposition $|\psi>=1/\sqrt{2}*(|0>+e^{i\varphi}|1>)$ which evolves over a total free precession time 2τ, if the microwave drive Rabi frequency is larger than other terms in the Hamiltonian, such as NV hyperfine coupling and the size of the magnetic field to be measured. The phase φ may be set to zero by definition, choosing the microwave drive field to be along the y axis (arbitrary). During the free precession time, the electron spin interacts with the external magnetic field. The |1> state acquires a phase with respect to the |0> state, corresponding to a precession of the spin in the plane perpendicular to the spin quantization axis in a Bloch sphere picture. Then, a first π microwave pulse 306 is applied to "swap" the phase acquired by the |0> and |1> states. For slow components of the environmental magnetic noise, the dephasing acquired during the first half of the sequence is compensated and spin dephasing induced by random noise from the environment may be reduced. Additionally, frequency components much higher than the frequency 1/τ average out to zero. Slow components may include, e.g., DC components and low frequency components on the order of several Hz, several tens of Hz, several hundreds of Hz, and 1-1000 kHz such as 10 Hz or less, 100 Hz or less, or 500 Hz or less, 1 kHz or less, 10 kHz or less, 100 kHz or less and 1 MHz or less. In some implementations, the pulse 306 is applied at the zero crossing of the classical AC magnetic field so that the spin phase accumulation due to the classical AC field can be enhanced. In some implementations, multiple π microwave pulses 306 are applied periodically. After applying one or more π microwave pulses 306, the phase φ and thus the magnetic field is measured by applying a second π/2 pulse 308 that projects the NV electronic spin back onto the quantization axis. The total phase accumulation is thus converted into an electron population, which may be read out optically through the spin-dependent PL of the NV defect(s). That is, a second optical pulse 310 is applied to the NV defect, or ensemble of NV defects, resulting in a photoluminescence that is read out by an optical detector. To derive the magnetic field B(t) from the PL measurement, the function describing the evolution of the $S_z$ operator under the pulse sequence is multiplied by the noise and signal fields, which is then integrated to get the phase accumulation and subsequently multiplied by contrast and total photoluminescence rate to get the photoluminescence signal (sine magnetometry). For cosine magnetometry, the filter function is convolved with the power spectral density of the noise and signal fields to get the phase variance, which is then multiplied by contrast and photoluminescence rate. Sensitivity compared to the continuous-wave driving technique may improve by a factor of at least $(T2/T2^*)^{1/2}$, in which T2 is the coherence time of the NV under AC magnetometry and T2* is inversely proportional to the NV linewidth.

An NV defect is just one example of a type of spin defect that may be used to perform electron spin defect based magnetometry using electron spin defect bodies. In other implementations, one or more spin defects may be formed in silicon carbide. SiC defects include defects due to other substitutional atoms, such as, e.g. phosphorus, in the SiC lattice. Similar techniques for detecting magnetic fields as described herein with NV defects may be employed with the SiC defects.

As described above, electron spin defects are optically excited from a ground state to an excited state, and then a photoluminescence is measured in order to measure a magnetic field. Therefore, there are at least two optical signals that are carried during magnetometry: the input excitation light that is coupled into the electron spin defect body, and the output photoluminescence that is emitted from the electron spin defect body. This light is typically transmitted in and out of the electron spin defect body by free space transmission, e.g., the light is directed to and from the electron spin defect body by a series of discrete lenses, mirror, and filters operating in free space, such that the light couples into and out of the electron spin defect body from air.

However, in some cases, such coupling of light leads to loss and low efficiency. For example, reflections at the air/electron spin defect body interface lead to reduced transmission in/out of the electron spin defect body, e.g., because of the refractive index mismatch between air (n=1) and diamond (n≈2.4). In addition, output photoluminescence is emitted from the electron spin defect body across a range of output angles, such that much of the output photoluminescence may not be collected by, for example, a collimating lens spaced apart from the electron spin defect body. Free-space transmission may also be associated with scattering in air. Free-space discrete optical components themselves may introduce loss, e.g., reflection and/or absorption. As another source of loss, beams transmitted in free space may become misaligned with the electron spin defects within the electron spin defect body (e.g., based on slight movements of lenses and other beam-shaping optics).

Implementations of the present disclosure can reduce these losses and increase efficiency by coupling light into and out of the electron spin defect bodies using optical fibers that are attached to the electron spin defect bodies.

Figure 4:
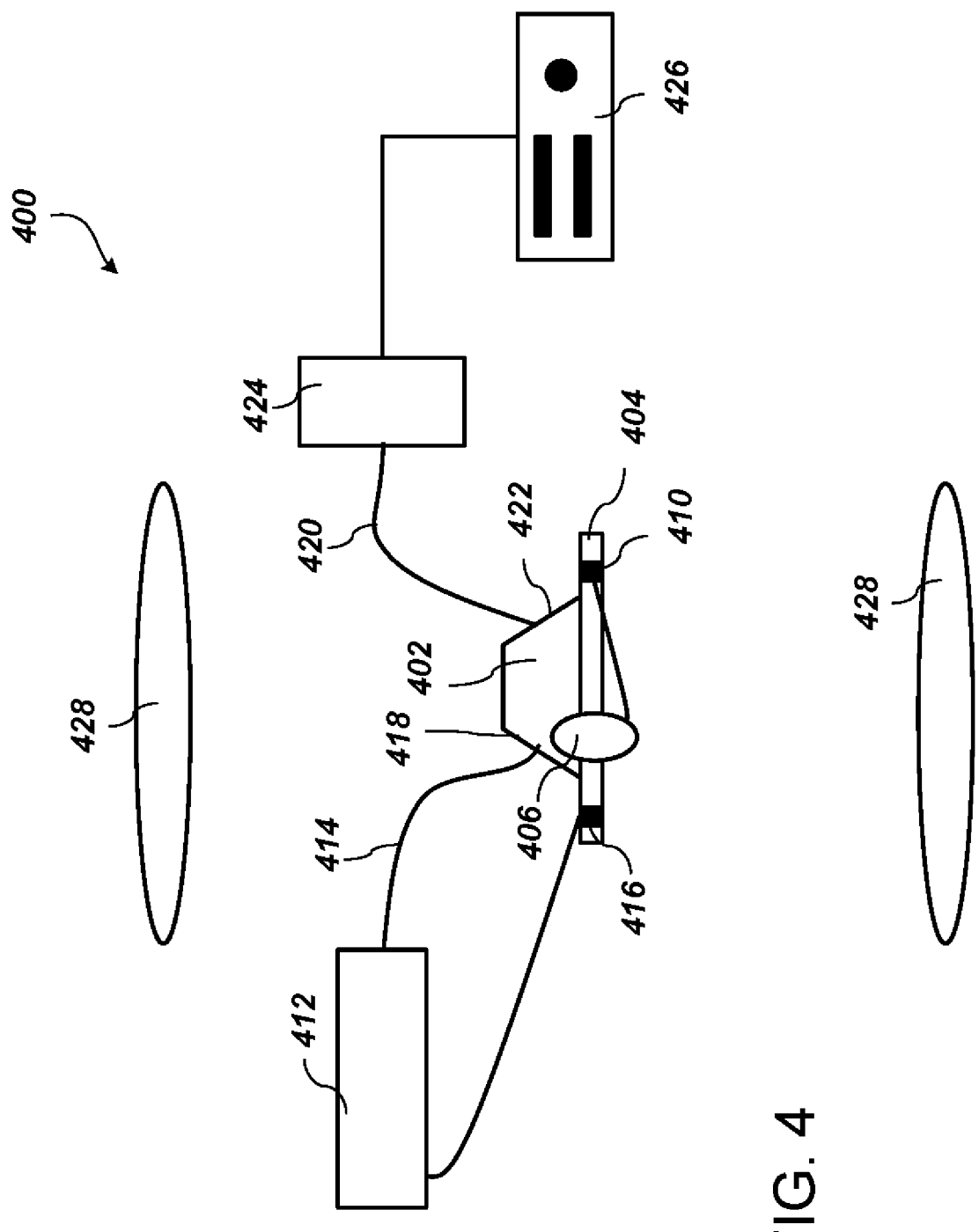
FIG. 4 is a schematic that illustrates an example of a device that may be used to perform electron spin defect based magnetometry.

FIG. 4 is a schematic showing an example of a device 400 that may be used to perform electron spin defect-based magnetometry, as described herein. Device 400 includes an electron spin defect body 402, which is disposed on a substrate 404. The electron spin defect body 402 includes multiple lattice point defects, such as NV defects formed in diamond, as described herein. The electron spin defect body 402 containing the NV defects may be formed, in some implementations, from up to 99.999% carbon 12. In some implementations, carbon 13 is used partially in place of carbon 12.

The electron spin defect body 402 is not limited to NV defects formed in diamond, and may include other lattice point defects in other materials, such as substitutional phosphorus atoms in silicon carbide, vacancies in silicon carbide (e.g., silicon vacancies), InGaAs quantum dots, and neutrally-charged silicon vacancies ($SiV^0$) in diamond. The electron spin defect body 402 may be a sub-portion of a larger body that is without electron spin defects. For example, the electron spin defect body 402 may be a top layer or top portion of a diamond body, with the rest of the diamond body (not shown) having no electron spin defects or fewer electron spin defects.

Dimensions of the electron spin defect body 402 can vary. For example, in some implementations, a thickness of the electron spin defect body 402 is less than about 1 millimeter, such as less than 750 microns, less than 500 microns, less than 250 microns, or less than 100 microns. In some implementations, the thickness is greater than about 10 microns, such as greater than 50 microns, greater than 100 microns, greater than 250 microns, greater than 500 microns, or greater than 750 microns. Other thicknesses may be used as well. Thickness of the electron spin defect body 402, as defined here, can refer to a smallest dimension of the electron spin defect body. In some cases, the thickness of the electron spin defect body 402 is defined as a distance from a surface of the electron spin defect body 402 in contact with the substrate 404 to an opposite surface of the electron spin defect body 402. In some cases, the thickness is defined as a distance from a surface of the electron spin defect body 402 delimiting the electron spin defect body 402 with respect to a larger body of which the electron spin defect body 402 is a part (as described above), to an opposite surface of the electron spin defect body 402.

Lateral dimensions of the electron spin defect body 402 (e.g., dimensions orthogonal to the thickness, such as length and width) can also vary. For example, in some implementations a width of the electron spin defect body 402 is greater than about 0.1 mm, such as greater than 0.5 mm, greater than 1 mm, greater than 2 mm, greater than 3 mm, or greater than 5 mm. In some implementations, the width is less than about 5 cm, such as less than 3 cm, less than 1 cm, or less than 5 mm. Other widths may be used as well.

In some implementations, the electron spin defect body 402 (or a larger body of which the electron spin defect body 402 is a part) is secured to the substrate 404 using an adhesive including, e.g., epoxies, elastomers, thermoplastics, emulsions, and/or thermosets, among other types of adhesives. In some implementations, electrical contacts are formed between the electron spin defect body 402 (or the larger body of which the electron spin defect body is a part) and the substrate 404. For example, in some cases, the substrate 404 may include a semiconductor material, such as silicon, in which one or more circuit elements are fabricated. Electrical connections may be formed within the substrate 404 to provide an electrical connection between the circuit elements and one or more components formed in or on the electron spin defect body 402 or the larger body of which the electron spin defect body 402 is a part.

Device 400 further includes a microwave field generator 406 that is configured to provide a microwave field to the electron spin defects of the electron spin defect body 402. For example, in various implementations, the microwave field generator 406 may include a thin film antenna formed on a surface of the electron spin defect body 402, such as an outer-facing surface of the electron spin defect body 402, at an interface between the electron spin defect body 402 and a larger body of which the electron spin defect body 402 is a part, and/or on or in the substrate 404. The microwave field generator 406 may include a co-planar waveguide, a wire, a loop, or a coil of electrically conductive material, such as metal. The microwave field generator 406 may be positioned adjacent to an area of the electron spin defect body 402 to which an input optical fiber is attached, as described in more detail below.

In some implementations, the device 400 includes a microwave field control circuit 410. The microwave field control circuit 410 may be formed in or on the substrate 404 or may be a device that is separate from the substrate. For example, in some implementations, the microwave field control circuit 410 may be a circuit element formed within a silicon substrate. The microwave field control circuit 410 may be coupled, e.g., directly electrically connected, to the microwave field generator 406 to provide a microwave source signal to the microwave field generator 406 so that the microwave field generator 406 emits a microwave field toward the electron spin defect body 402. The microwave source signal may optionally be a pulsed microwave source signal.

In some implementations, a microwave frequency of the microwave source signal is between about 2 GHz and about 4 GHz. In some implementations, the microwave field generator 406 emits signals at multiple frequencies spaced apart from one another to drive additional energy level splittings. For example, in some implementations, the microwave field generator 406 may be operated to emit microwave signals that address NV hyperfine transitions. In some implementations, the microwave control field circuit 410 is configured to provide a control signal that generates a pulsed microwave signal at the microwave field generator 406. In some implementations, the microwave field control circuit 410 is configured to provide a control signal that generates a continuous wave microwave signal at the microwave field generator 406.

The device 400 includes an optical source 412 configured to emit input light. The input light emitted by the optical source 412 may include a first wavelength that excites the one or more lattice point defects within the electron spin defect body 402 from a ground state to an excited state. The first wavelength is different from a second wavelength that is emitted by the lattice point defects upon relaxation. The first wavelength may be, e.g., about 532 nm to excite NV defects in the electron spin defect body 402. The optical source 412 may include, e.g., a light emitting diode, a laser, or a broadband source that includes filters configured to block transmission of wavelengths other than those used to excite the lattice point defects.

The optical source 412 emits the input light into an input optical fiber 414 that is optically coupled to the optical source 412. The input optical fiber 414 is configured to carry the input light of the first wavelength emitted by the optical source 412. In some implementations, the input optical fiber 414 is a single-mode optical fiber, which may stabilize the optical path of the input light as it travels through the input optical fiber 414. However, in some implementations the input optical fiber 414 is a multi-mode optical fiber. Multi-mode optical fibers, in some implementations, can transmit a higher laser power throughput than equivalent single-mode optical fibers.

In some implementations, the device 400 includes an optical source circuit, e.g., a driver 416 for the optical source 412, with the driver 416 coupled to the optical source 412 to provide a control signal to drive the optical source 412. The driver 416 may be formed in or on the substrate 404 or may be a device that is separate from the substrate. For example, in some implementations, the driver 416 may be a circuit element formed within a silicon substrate. The driver 416 may be coupled, e.g., directly electrically connected, to the optical source 412.

The input optical fiber 414 is attached to a first face 418 of the electron spin defect body 402 (e.g., by an adhesive) and is arranged to direct the input light through the first face 418, such that the input light excites spin defects in the electron spin defect body 402. Further details on the fiber-defect body coupling and attachment are given below and throughout this disclosure.

The input light directed into the electron spin defect body 402 excites spin defects that emit photoluminescence of a second wavelength. At least some of this photoluminescence is captured by an output optical fiber 420 that is attached to a second face 422 (e.g., by an adhesive) of the electron spin defect body 402. The photoluminescence may include one or more wavelengths of light, such as wavelengths of about 637 nm, corresponding to the emission wavelength of an NV defect.

As described for the input optical fiber 414, in some implementations the output optical fiber 420 is a multi-mode optical fiber with a greater light capture area than an analogous single-mode optical fiber. In some implementations, the input optical fiber 414 and the output optical fiber 420 are different, e.g., the two optical fibers may be configured to transmit light of different wavelengths or different wavelength ranges, which may be overlapping or non-overlapping. In some implementations, the relative wavelength ranges that the two optical fibers are configured to transmit have a filtering effect distinct from any filtering from separate filtering devices.

In some implementations, the input optical fiber 414 and output optical fiber 420 are silicon oxide optical fibers; however, other materials may also be used.

The output optical fiber 420 is optically coupled to a photodetector 424 that detects the photoluminescence transmitted by the output optical fiber 420. As described above, this photoluminescence (e.g., a magnitude of the photoluminescence) is indicative of a magnetic field (e.g., a time-varying magnetic field) to which the electron spin defect body 402 is exposed.

In some implementations, the device 400 includes a processor 426. The processor 426 is coupled to the photodetector 424 to receive a light measurement signal from the photodetector 424 and is configured to analyze the light measurement signal to determine the characteristics of the magnetic field to which the electron spin defect body 402 is exposed. The processor 426 may be formed in or on the substrate 404 or may be a device that is separate from the substrate. For example, in some implementations, the processor 426 is a circuit element formed within a silicon substrate. The processor 426 may be coupled, e.g., directly electrically connected, to the photodetector 424. In some implementations, the processor 426 is located remotely from the device 400. For example, in some implementations, the device 400 includes a transmitter/receiver to wirelessly receive control and/or analysis signals from the processor 426 and to wirelessly transmit feedback and measurement data to the processor 426.

In some implementations, the processor 426 is coupled to one or both of the microwave field control circuit 410 and the driver 416 to control operation of the microwave field control circuit 410 and/or the driver 416.

In some implementations, the device 400 includes a magnet 428. The magnet 428 may be arranged adjacent to the electron spin defect body 402. The magnet 428 is provided to induce the Zeeman effect and lift the degeneracy of the $m_s=+/-1$ spin sublevels. In some implementations, the magnet 428 is a permanent magnet. In some implementations, the magnet 428 is an electromagnet. The magnet 428 may be positioned directly on the substrate 404, on the electron spin defect body 402, or in another location. The magnet geometry may be chosen to minimize effects of inhomogeneous broadening between distinct defects in the electron spin defect body 402.

In some implementations (e.g., some scalar magnetometry implementations), the magnet 428 is arranged such that the bias magnetic field generated by the magnet 428 aligns with spin axes of the NV defects, e.g., projects equally onto multiple axes of the four possible orientation axes of the NV defects. For example, in a sample in which spin axes point along 0°-180° and 90°-270°, the magnet 428 might be arranged to apply a magnetic field in the 45°-225° direction, such that applied magnetic field strengths along the spin axes are equal and time-varying magnetic field strength along both axes is measured together.

In some implementations (e.g., some multi-vector magnetometry implementations), the magnet 428 is arranged so as to split PL intensity lines from the NV defects into four individual lines, representing the four possible orientation axes, by causing each spin axis to be exposed to a different magnetic field. For example, in the example given above, the magnet 428 (in some implementations, more than one magnet) would be arranged to apply different magnetic field strengths in the 0°-180° direction and the 90°-270°, such that time-varying magnetic field strengths along the axes may be measured independently.

Note that some implementations do not include a magnet 428.

Although FIG. 4 shows one input optical fiber, one output optical fiber, and one photodetector, in some implementations the device 400 includes multiple input fibers, multiple output fibers, and or multiple photodetectors.

Ends of optical fibers may sometimes be referred to as an "input end" or an "output end," and optical fibers may sometimes be referred to as "input optical fibers" or "output optical fibers." These terms do not imply any necessary differentiation between the two ends/fibers, but rather relate to their particular arrangement and configuration within a magnetometer.

Figure 5:
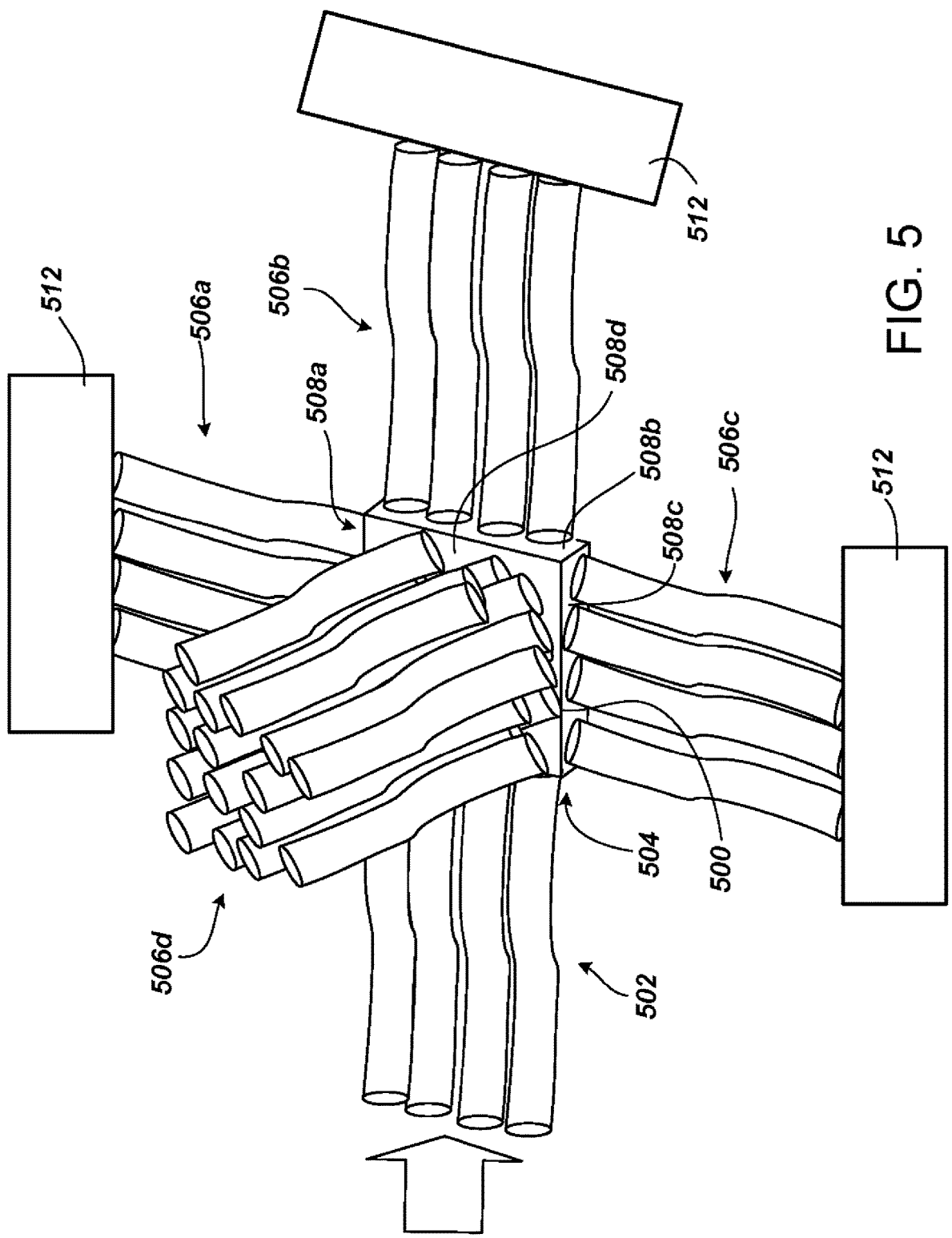
FIG. 5 is a schematic that illustrates an exemplary electron spin defect body and optical fibers.

FIG. 5 shows an example of optical fibers attached to an electron spin defect body 500. Specifically, a first plurality of optical fibers 502 (e.g., a fiber bundle) is attached to a first face 504 of the electron spin defect body 500. The first plurality of optical fibers 502 carries input light from an optical source to the electron spin defect body 500, directing the light into the electron spin defect body 500 through the first face 504.

Other pluralities of optical fibers 506a, 506b, 506c, and 506d (e.g., fiber bundles) are attached to respective other faces 508a, 508b, 508c, 508d. These other pluralities of optical fibers 506a, 506b, 506c, 506d are output fibers that carry photoluminescence that is emitted by spin defects of the electron spin defect body 500 and transmitted through the respective other faces 508a, 508b, 508c, 508d.

A sixth face (an underside of the electron spin defect body 500, not labeled in FIG. 6) may have input or output fibers attached, or may be a face that rests on a substrate. In some implementations, the face that rests on the substrate is a face orthogonal to the depth (e.g., narrowest dimension) of the electron spin defect body 500.

Each plurality of optical fibers 506a, 506b, 506c, 506d is optically coupled, at an end opposite the end attached to the electron spin defect body 500, to a photodetector 512, e.g., the photodetector 424 of FIG. 4. For example, a multi-fiber coupling element (not shown in FIG. 5) may take in the photoluminescence from each of the pluralities of optical fibers 506a, 506b, 506c, 506d and combine the photoluminescence into a single optical input to the photodetector 424. In some implementations, multiple photodetectors may be used, e.g., one photodetector for each plurality of optical fibers or one photodetector for each fiber bundle.

The use of multiple input fibers on the first face 504 can increase a magnitude of excitation of the electron spin defects in the electron spin defect body 500, because light from each input optical fiber can excite spin defects in a respective portion of the electron spin defect body. In some implementations, input fibers are attached to multiple faces of the electron spin defect body 500.

The use of multiple output fibers on each other face 508a, 508b, 508c, 508d, and the use of multiple faces for photoluminescence collection (as opposed to a single face) can increase the efficiency of photoluminescence, because the output photoluminescence can be collected across a larger solid angle of emission from the electron spin defect body 500. In an equivalent free-space device, much of this photoluminescence might not be collected by collection lenses and/or photodetectors.

Moreover, as described above, because the pluralities of optical fibers 502, 506a, 506b, 506c, 506d are attached to the electron spin defect body 500 and are arranged to couple light into or out of the electron spin defect body (in some implementations, via an adhesive), the efficiency of light coupling in and out of the electron spin defect body 500 is increased compared to free-space light coupling.

Together, increases in excitation and collection efficiency can boost overall quantum efficiency from about 4% using free-space transmission to 90% or even higher using fiber-coupled transmission, in various implementations. The quantum efficiency is the ratio of detected photons captured by detectors to input photons emitted by the optical source.

The pluralities of optical fibers, both input fibers and output fibers, are attached to their respective faces by an adhesive. For example, the adhesive may be interposed between an end of each optical fiber and the face of the electron spin defect body 500 to which the optical fiber is attached. The adhesive may be arranged such that it fills an entire gap between the optical fiber and the electron spin defect body 500.

In some implementations, input light passing from an input fiber to the electron spin defect body 500 and/or photoluminescence passing from the electron spin defect 500 to an output fiber passes through the adhesive on its way to/from the electron spin defect body 500. Therefore, the optical properties of the adhesive can be important.

In some implementations, the adhesive has a refractive index that substantially matches a refractive index of the input optical fibers and/or output optical fibers. For example, the adhesive may have a refractive index within about 0.01 of a refractive index of the input and/or output optical fibers. In some implementations, the adhesive has a refractive index within about 0.1 of a refractive index of the input and/or output optical fibers, such as within 0.05, within 0.01, or within 0.005.

In some implementations, in order to disallow total internal reflection, the adhesive has a refractive index that is greater than a refractive index of the input optical fibers and/or output optical fibers and less than a refractive index of the electron spin defect body. For example, the adhesive may have a refractive index between 1.4 and 2.4. In some implementations, the adhesive has a refractive index between 1.42 and 1.48. These refractive indices are listed in reference to 532 nm light.

In addition, the adhesive does not absorb light of the first (input) wavelength or the second (photoluminescence) wavelength, e.g., has transparency greater than 99% or greater than 90% for these wavelengths of light.

The adhesive coupling the optical fibers to the electron spin defect body may be a UV-curable optical glue and may be different from an adhesive that attaches the electron spin defect body to the substrate. To attach the optical fibers, the optical fibers can be dipped in the adhesive and placed in their desired final position very close to the electron spin defect body. UV illumination is applied to cure the adhesive and attach the optical fibers to the electron spin defect body.

To reduce internal reflection and interference, in some implementations the optical fibers are attached at a normal angle to the surfaces of the electron spin defect body to which they are attached, e.g., at an angle between 85° and 95° or between 88° and 92°. Other attachment angles may also be used.

In some cases, it may be desirable to filter either or both of the input light or the collected photoluminescence. For example, input light transmitted through the electron spin defect body may be collected by an output fiber and contribute to measured photoluminescence magnitude, even though the input light is not photoluminescence. This can reduce the sensitivity of magnetic field collection (e.g., by introducing noise), or may lead to incorrect sensing determinations.

On the input side, high laser power may create fluorescence within the input optical fiber that overlaps with the NV emission wavelength (second wavelength). Therefore, in some implementations a filter on the input side of the system (e.g., any of the filter types and configurations described herein) may be configured to filter out light of the second wavelength while passing light of the first wavelength.

The inclusion of input optical fibers attached to one or more first faces and output optical fibers attached to one or more second, different faces (e.g., exclusively input optical fibers attached to the one or more first faces and exclusively output optical fibers attached to the one or more second faces) may provide sensing, efficiency, and/or filtering advantages. For example, separate faces being used for separate optical functions allows thin-film optical filters to be deposited over the faces to perform specific filtering functions, as described below.

In some implementations one or more faces of the electron spin defect body are attached to both input and output optical fibers.

The faces of the electron spin defect body 500 may be defined by dicing and/or cleaving. In some implementations, the faces of the electron spin defect body 500 correspond to one or more crystal planes of the electron spin defect body 500, e.g., a <100> plane.

The faces of the electron spin defect body 500 may be polished in order to increase light transmission in/out of the electron spin defect body 500, in order to allow for more uniform attachment of optical fibers, and/or in order to provide a smooth substrate for the deposition of thin-film optical filters.

Figure 6A:
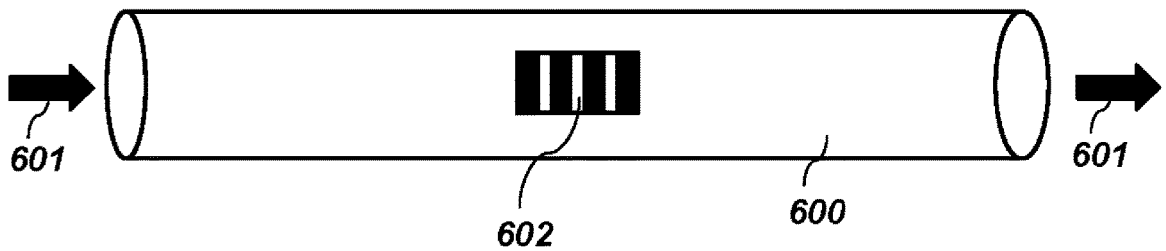
FIGS. 6A-6C are schematics illustrating examples of optical filters.
Figure 6B:
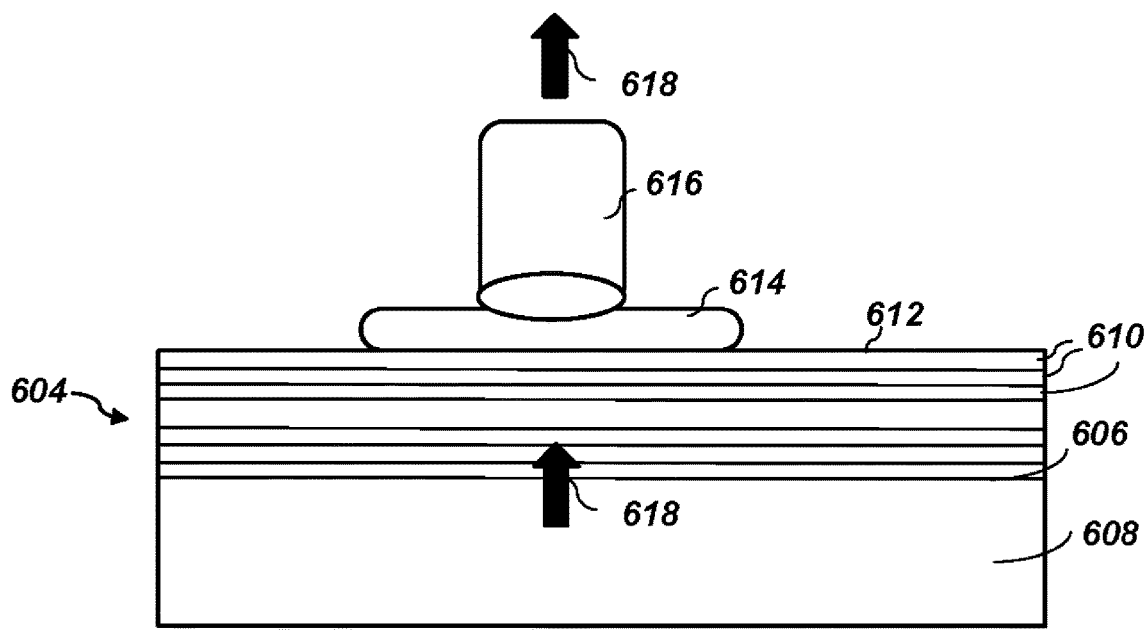
Figure 6C:
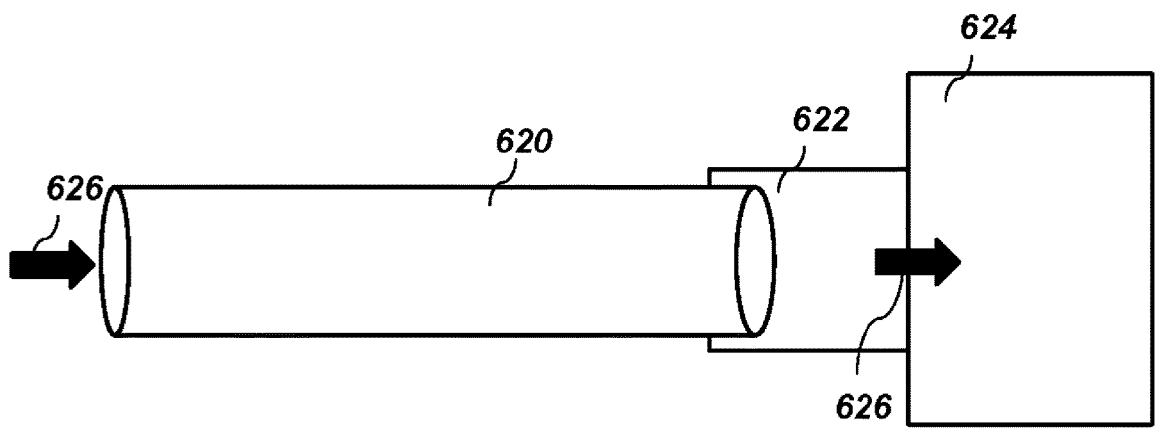

FIGS. 6A-6C show three possible methods of light filtering in a fiber-coupled magnetometer as described herein.

Each of these methods may be used alone, or they may be used in conjunction with one another.

FIG. 6A shows an example of a filter 602 integrated into an optical fiber 600, e.g., an input optical fiber or an output optical fiber. In an output fiber through which photoluminescence 601 passes, the filter 602 may be a filter configured to pass light of the second (photoluminescence) wavelength while blocking light of the first (input wavelength). For example, the filter 602 may be a bandpass filter where the second wavelength is in the passband and the first wavelength is outside the passband, or the filter 602 may be a high-pass filter where the second wavelength is greater than the cutoff wavelength and the first wavelength is less than the cutoff wavelength. In some implementations, the filter 602 is a notch filter configured to block light of the first wavelength and pass light of the second wavelength. Multiple filters may be integrated into a single optical fiber. In-fiber filters may include, for example, Bragg gratings.

FIG. 6B shows an example of a thin-film filter 604 disposed on a face 606 of an electron spin defect body 608. The thin-film filter 604 includes multiple distinct layers 610 that together perform an optical filtering function. On an exposed surface 612 of the thin-film filter 604, an adhesive 614 attaches an output optical fiber 616 to the thin-film filter 604, such that photoluminescence 618 emitted from point defects of the electron spin defect body 608 passes through the thin-film filter 604, is filtered, and is subsequently collected by the output optical fiber 616.

Although this example shows thin-film filtering for photoluminescence collection, thin-film filters may also be used on a face of an electron spin defect body into which input light is directed.

The layers 610 of the thin-film filter 604 are dielectric materials (e.g., doped glass, polymers, or metal oxides) or other materials with relative refractive indices such that the thin-film filter 604 as a whole performs filtering to, for example, block light of the first wavelength while passing light of the second wavelength. For example, in some implementations the layers 610 form a quarter-wave stack with a stopband that covers the first wavelength but not the second wavelength. In some implementations, the layers 610 form a Fabry-Perot cavity with a passband that covers the second wavelength but not the first wavelength (e.g., two quarter-wave stacks with an interposed spacer layer). Other configurations of the layers 610 may also be used.

In some implementations, one or more of the layers 610 has a thickness less than about 500 nm, such as less than 400 nm, less than 300 nm, or less than 200 nm. In some implementations, one or more of the layers 610 has a thickness that is about $t=\lambda_2/(4n)$, where $\lambda_2$ is the second wavelength and n is a refractive index of the one or more layers. In some implementations, one or more of the layers 610 has a thickness that is about $t=\lambda_1/(4n)$, where $\lambda_1$ is the first wavelength and n is a refractive index of the one or more layers. In some implementations, at least three adjacent layers of the layers 610 have alternating higher and lower refractive indices.

The layers 610 may be deposited using thermal evaporation, electron beam evaporation, sputtering (e.g., ion beam sputtering), or another deposition method. In some implementations, to manufacture a magnetometer, a first face to which input fibers will be attached is masked, and other faces are exposed, either simultaneously or sequentially, to thin-film filter deposition to form a thin-film filter that blocks light of the first wavelength while passing light of the second wavelength. Subsequently, or previously, in some implementations, the other faces are masked while the first face is exposed to a different thin-film deposition process that produces a thin-film filter to block light of the second wavelength while passing light of the first wavelength.

FIG. 6C shows an example of fiber-coupled filtering. An output fiber 620 is optically coupled to a discrete, fiber-coupled optical filter 622, which is itself optically coupled to a photodetector 624. Photoluminescence 626 is collected by the output fiber 620, transferred to the optical filter 622, filtered to block light of the first wavelength while passing light of the second wavelength, and subsequently transferred to the photodetector 624. The optical filter 622, alone or in combination with other filters that may be optically coupled along the output light transmission path, may perform any or all of the filtering functions described in this disclosure.

Although this example shows discrete, fiber-coupled filtering for photoluminescence collection, discrete, fiber-coupled filters may also be used to filter input light. In addition, discrete, fiber-coupled optical filters may be located in locations or configurations, e.g., an output of a fiber-coupled filter may be attached to another fiber that is optically coupled to a photodetector.

Filtering operations such as "blocking" and "passing" are relative terms. For example, an output-coupled optical filter as described herein may "block" light of the first wavelength and "pass" light of the second wavelength in that the filter transmits a higher proportion of light of the second wavelength than light of the first wavelength.

Each of the filtering schemes shown in FIGS. 6A-6C can be implemented at little or no cost in device size, whereas light filtering in a free-space light input/collection device may necessitate significantly larger discrete filtering components. Specifically, the fiber-integrated and thin-film filtering schemes may be implemented with essentially no change in magnetometer form-factor compared to a magnetometer without optical filtering, and the fiber-coupled discrete filtering scheme may be implemented using compact fiber-coupled filters. By contrast, free-space optical filters are often significantly larger.

Similarly, the optical fiber magnetometers described in this disclosure may be smaller than comparable free-space magnetometers, because discrete lenses and mirrors that would be required in a free-space magnetometers may be omitted.

Besides the above-noted advantages in input efficiency, output efficiency, and form-factor, the optical fiber magnetometers described in this disclosure may require less calibration and may be more reliable (e.g., more mechanically robust) than comparable free-space magnetometers, because fiber-coupled optics may be less likely to be misaligned or lose alignment than are free-space optics.

Figure 7:
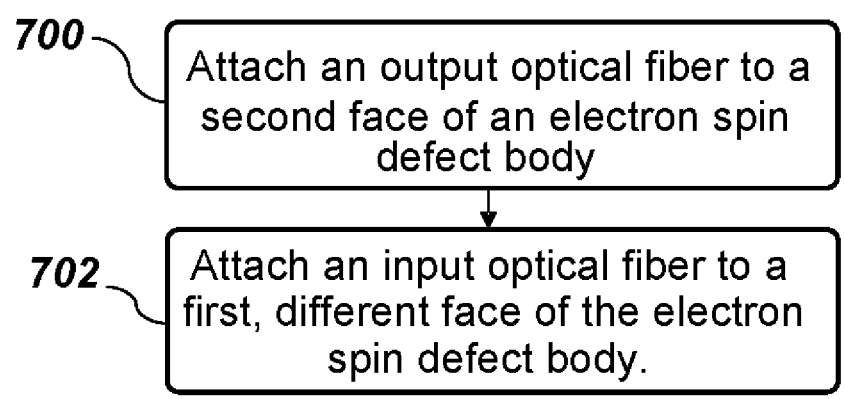
FIG. 7 is a flowchart illustrating an example process for manufacturing a magnetometer.

At least some magnetometers described in this disclosure may be fabricated according to the example method shown in FIG. 7. An output optical fiber is attached to a second face of an electron spin defect body (700). In some implementations, an adhesive is first deposited onto the second face, and the output optical fiber is subsequently attached to the second face by the adhesive. In some implementations, the adhesive is first applied to the output optical fiber, and then the optical fiber and adhesive are attached to the electron spin defect body.

An input optical fiber is attached to a first, different face of the electron spin defect body (702).

In some implementations, before the output optical fiber is attached to the second face, a thin-film optical filter is deposited formed (e.g., deposited) onto the second face of an electron spin defect body. The thin-film optical filter is configured to pass photoluminescence emitted by spin defects in the electron spin defect body while blocking another wavelength of light, e.g., a wavelength of light that excites the spin defects from a ground state to an excited state.

In some implementations, the output optical fiber includes an embedded optical filter (e.g., a Bragg filter) configured to pass the photoluminescence while blocking the other wavelength of light.

A photodetector may be optically coupled to the output optical fiber and an optical source may be optically coupled to the input optical fiber, as described elsewhere in this disclosure. The optical source may be configured to emit the wavelength of light that excites the spin defects. Further details on fiber-coupled magnetometers, including details of thin-film optical filters, are disclosed throughout this disclosure.

Figure 8:
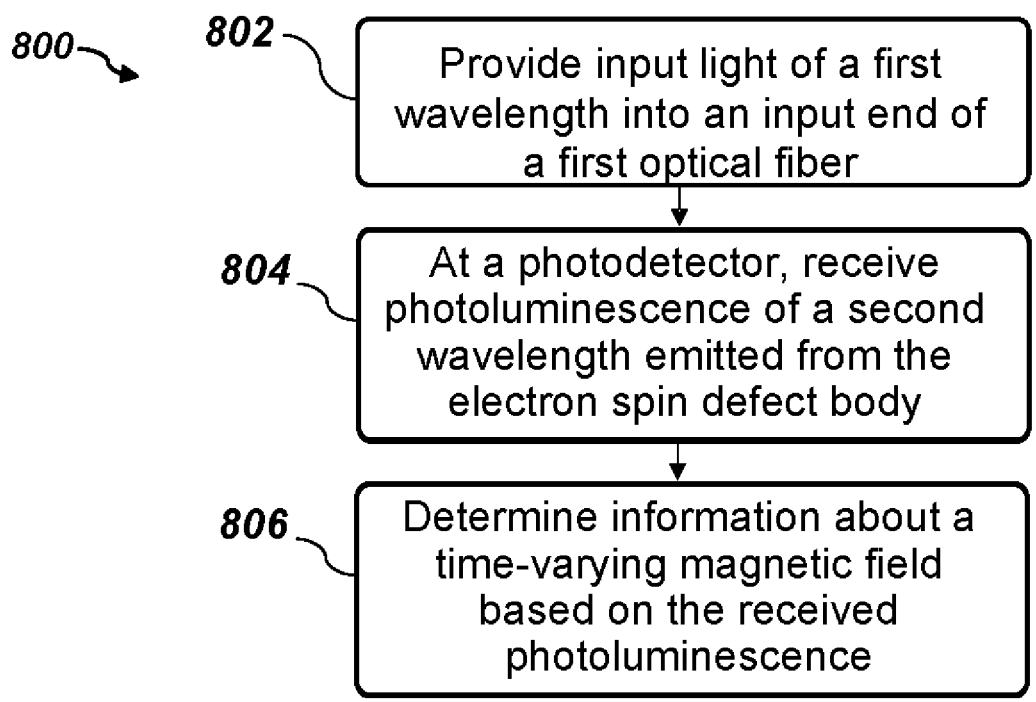
FIG. 8 is a flowchart illustrating an example process for measuring a magnetic field.

FIG. 8 shows an example method 800 according to some implementations of this disclosure. Input light of a first wavelength is provided into an input end of a first optical fiber (802). An output end of the first optical fiber is attached to a first face of an electron spin defect body and is arranged to direct the input light into the first face of the electron spin defect body. The electron spin defect body is exposed to the time-varying magnetic field.

At a photodetector, photoluminescence of a second wavelength is received emitted from the electron spin defect body (804). The photoluminescence is carried from a second face of the electron spin defect body to the photodetector by a second optical fiber. An input end of the second optical fiber is attached to the second face of the electron spin defect body. The second wavelength is different from the first wavelength, and the second face is different from the first face Information about the time-varying magnetic field is determined based on the received photoluminescence (806).

Further details on methods of measuring time-varying magnetic fields are disclosed throughout this disclosure.

The electron spin defect based magnetometry techniques and devices described herein are viable for compact, room temperature magnetometry, and are robust to large magnetic field variations. In some implementations, the magnetometer can be used in applications such as magnetocardiography to detect magnetic fields from the heart. In particular, compact, robust spin defect based magnetometers may be used to detect magnetic fields emanating from the heart for continuous, long-term monitoring and early detection of various cardiac conditions.

Cardiovascular disease is the number one cause of death worldwide. Electric and magnetic fields generated by the heart contain information about the onset of a dangerous condition such as a heart attack or arrhythmia. However, technologies for monitoring this vital organ may be bulky, noisy, and in non-clinical settings can only be used for up to a few days at a time, making the continuous acquisition of data over at best problematic. Moreover, current analyses must be performed by a medical professional after the data is taken, severely limiting the amount of data that can be analyzed and further increasing the cost (and decreasing the scope and accessibility) of these vital services.

The sensors required to detect the small magnetic fields tend to require operation in a shielded room (such as optically pumped magnetometers), or at cold temperatures (such as SQUIDS), making continuous acquisition and monitoring difficult. The magnetometers disclosed herein may be used, in certain implementations, as quantum sensors to measure magnetic fields from the heart and may be operated outside of a shielded room, at room temperature and offer a large dynamic range of up to 100 mT. Moreover, the device may be constructed so it is compact and can be worn comfortably and close to the body.

The magnetometers described herein may also be used in applications besides magnetocardiography. For example, the magnetometers may be used to measure neuron activity. In some cases, the magnetometers may be used to detect magnetic fields created by electrical currents on a chip, thereby directly mapping on-chip circuit activity. The magnetometers described in this disclosure may be used in any application in which high-sensitive magnetic field measurement is desired.

Embodiments and functional operations described in this specification, such as the operations and analysis performed by the processor, the microwave field control circuit, the optical source driver, may be implemented in digital electronic circuitry, or in computer software, firmware, or hardware, including the structures disclosed in this specification and their structural equivalents, or in combinations of one or more of them. Embodiments may be implemented as one or more computer program products, i.e., one or more modules of non-transient computer program instructions encoded on a non-transient computer readable medium for execution by, or to control the operation of, a data processing apparatus. The computer readable medium may be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

Processors suitable for the execution of a computer program include, by way of example, both general and special purpose microprocessors, and any one or more processors of any kind of digital computer. Generally, a processor will receive instructions and data from a read only memory or a random access memory or both.

While this specification contains many specifics, these should not be construed as limitations on the scope of the disclosure or of what may be claimed, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products A number of embodiments have been described. Nevertheless, it will be understood that various modifications may be made without departing from the spirit and scope of the invention. Accordingly, other embodiments are within the scope of the following claims.

What is claimed is:

1. A magnetometer comprising:
    an electron spin defect body comprising a plurality of lattice point defects;
    a microwave field transmitter to apply a microwave field to the electron spin defect body;
    an optical source configured to emit input light of a first wavelength that excites the plurality of lattice point defects of the electron spin defect body from a ground state to an excited state;
    a first optical fiber having an input end optically coupled to the optical source and an output end, wherein the output end is attached to a first face of the electron spin defect body and is arranged to direct the input light into the first face of the electron spin defect body;
    a second optical fiber having an output end and an input end, wherein the input end of the second optical fiber is attached to a second face of the electron spin defect body and is arranged to receive photoluminescence of a second wavelength emitted from the electron spin defect body through the second face of the electron spin defect body, wherein the second wavelength is different from the first wavelength and wherein the second face is different from the first face;
    a photodetector optically coupled to the output end of the second optical fiber; and
    a third optical fiber, the third optical fiber having an output end optically coupled to the photodetector and an input end, wherein the input end of the third optical fiber is attached to a third face of the electron spin defect and is arranged to receive the photoluminescence through the third face, and wherein the third face is different from the first face and the second face.

2. The magnetometer of claim 1, comprising a fourth optical fiber, the fourth optical fiber having an input end optically coupled to the optical source and an output end, wherein the output end of the fourth optical fiber is attached to the first face of the electron spin defect body and arranged to direct the input light into the first face of the electron spin defect body.

3. The magnetometer of claim 1, wherein the first optical fiber and the second optical fiber are attached to the electron spin defect body by an adhesive that is substantially transparent to light of the first wavelength and light of the second wavelength.

4. The magnetometer of claim 1, wherein the second optical fiber comprises a Bragg filter configured to pass light of the second wavelength and block light of the first wavelength.

5. The magnetometer of claim 1, wherein the second face comprises a thin-film optical filter configured to pass light of the second wavelength and block light of the first wavelength.

6. The magnetometer of claim 1, comprising an optical filter coupled to the output end of the second optical fiber, wherein the optical filter is configured to pass light of the second wavelength and block light of the first wavelength.

7. The magnetometer of claim 1, comprising a magnet arranged adjacent to the electron spin defect body.

8. A method of measuring a time-varying magnetic field, comprising:
    providing input light of a first wavelength into an input end of a first optical fiber, wherein an output end of the first optical fiber is attached to a first face of an electron spin defect body and is arranged to direct the input light into the first face of the electron spin defect body, and wherein the electron spin defect body is exposed to the time-varying magnetic field;
    receiving, at a photodetector, photoluminescence of a second wavelength emitted from the electron spin defect body, wherein the photoluminescence is carried from a second face of the electron spin defect body to the photodetector by a second optical fiber and from a third face of the electron spin defect body to the photodetector by a third optical fiber, wherein an input end of the second optical fiber is attached to the second face of the electron spin defect body, wherein an input end of the third optical fiber is attached to the third face of the electron spin defect body, wherein the second wavelength is different from the first wavelength, wherein the second face is different from the first face, and wherein the third face is different from the first face and the second face; and
    determining information about the time-varying magnetic field based on the received photoluminescence.

9. The method of claim 8, comprising filtering the photoluminescence to block light of the first wavelength and pass light of the second wavelength.

10. The method of claim 9, wherein filtering the photoluminescence comprises filtering the photoluminescence using a Bragg filter embedded in the second optical fiber.

11. The method of claim 9, wherein filtering the photoluminescence comprises filtering the photoluminescence using a thin-film optical filter disposed on the second face of the electron spin defect body.

12. The method of claim 9, wherein filtering the photoluminescence comprises filtering the photoluminescence using a fiber-coupled filter coupled to the second optical fiber.

13. The method of claim 8, comprising applying a microwave signal to the electron spin defect body.

14. The method of claim 8, comprising applying a second magnetic field to the electron spin defect body.

\* \* \* \* \*